United States Patent [19]

Dureux

[11] Patent Number: 4,642,623

[45] Date of Patent: Feb. 10, 1987

[54] TELEVISION-TYPE INTERLACED DISPLAY DEVICE AND DIGITAL OSCILLOSCOPE COMPRISING SUCH A DEVICE

[75] Inventor: Pierre J. C. Dureux, Corbeil-Essonnes, France

[73] Assignee: U.S. Philips Corporation, New York, N.Y.

[21] Appl. No.: 485,571

[22] Filed: Apr. 15, 1983

[30] Foreign Application Priority Data

Apr. 16, 1982 [FR] France ................................ 82 06589
Mar. 16, 1983 [FR] France ................................ 83 04281

[51] Int. Cl.⁴ .............................................. G09G 1/06
[52] U.S. Cl. .................................. 340/728; 340/723; 340/747; 358/242
[58] Field of Search ............... 340/728, 723, 732, 744, 340/747; 358/242, 258, 152

[56] References Cited

U.S. PATENT DOCUMENTS

| | | | |
|---|---|---|---|
| 4,263,593 | 4/1981 | Dagostino et al. | 340/728 |
| 4,300,162 | 11/1981 | Robers | 358/167 |
| 4,454,506 | 7/1984 | Netravali et al. | 340/728 |
| 4,455,572 | 6/1984 | Malden | 358/242 |

FOREIGN PATENT DOCUMENTS

| | | | |
|---|---|---|---|
| 2640759 | 3/1978 | Fed. Rep. of Germany | 340/728 |
| 0022725 | 2/1979 | Japan | 340/728 |
| 0072240 | 5/1980 | Japan | 340/728 |

OTHER PUBLICATIONS

Dowden, "Reduction of Flicker in Interlaced CRT Data Displays", IBM Technical Journal, vol. 21, No. 4, Sep. 1978.

Primary Examiner—Gerald L. Brigance
Assistant Examiner—Jeffery A. Brier
Attorney, Agent, or Firm—Thomas A. Briody; William J. Streeter; Marianne R. Rich

[57] ABSTRACT

Display device used to display a signal obtained by sampling and stored in a memory and recovered by interpolation points or interpolation vectors and in order to suppress the effect of light fluctuation of the interpolation segments (P) which represent horizontal or somewhat sloping portions of the light trace to be displayed, comprising processing means which, associated with each interpolation segment (P) which have a predetermined energy and are located on one line in one of the fields, for generating at least one and generally two further parallel, so-called anti-flicker segments ($I_A$) and ($I_B$) which have a two times weaker energy and are located in the other field, that is to say on one or two lines of the further field which lines enclose the relevant line in the first field.

4 Claims, 8 Drawing Figures

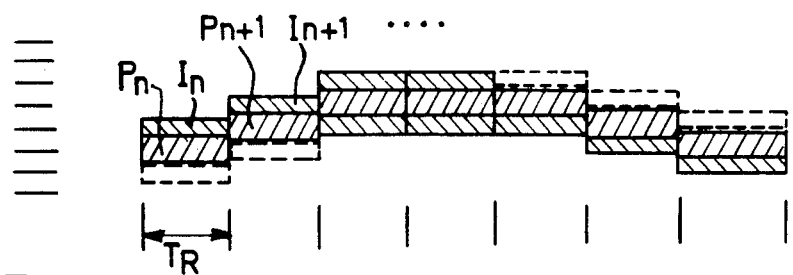
FIG. 6
| | C | $B_8$ $2^8$ | $B_7$ $2^7$ | $B_6$ $2^6$ | $B_5$ $2^5$ | $B_4$ $2^4$ | $B_3$ $2^3$ | $B_2$ $2^2$ | $B_1$ $2^1$ | $B_0$ $2^0$ |
|---|---|---|---|---|---|---|---|---|---|---|
| | +4 | 1 | 0 | 0 | 0 | 0 | 0 | 0 | 1 | 0 0 |
| | +3 | 1 | 0 | 0 | 0 | 0 | 0 | 0 | 1 | 1 |
| $FA_1$ | +2 | 1 | 0 | 0 | 0 | 0 | 0 | 0 | 1 | 0 |
| | +1 | 1 | 0 | 0 | 0 | 0 | 0 | 0 | 0 | 1 |
| | 0 | 1 | 0 | 0 | 0 | 0 | 0 | 0 | 0 | 0 |
| $FA_2$ | -1 | 0 | 1 | 1 | 1 | 1 | 1 | 1 | 1 | 1 |
| | -2 | 0 | 1 | 1 | 1 | 1 | 1 | 1 | 1 | 0 |
| | -3 | 0 | 1 | 1 | 1 | 1 | 1 | 1 | 0 | 1 |
| | -4 | 0 | 1 | 1 | 1 | 1 | 1 | 1 | 0 | 0 |
| | -5 | 0 | 1 | 1 | 1 | 1 | 1 | 0 | 1 | 1 |
FIG. 7
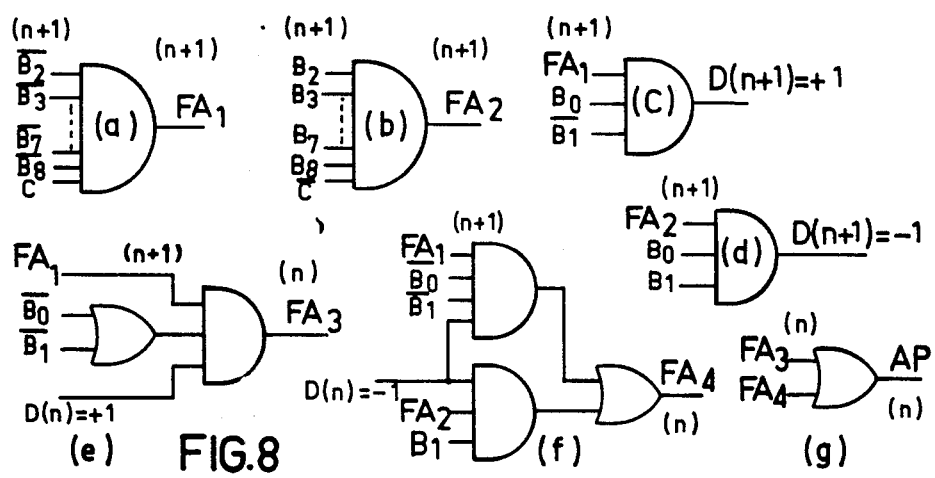
FIG. 8

TELEVISION-TYPE INTERLACED DISPLAY DEVICE AND DIGITAL OSCILLOSCOPE COMPRISING SUCH A DEVICE

BACKGROUND OF THE INVENTION

This invention relates to a television-type interlaced display device comprising, to suppress the effect of light fluctuations of segments of the light trace to be displayed, processing means which are associating to segments being located on a line or one of the fields further parallel, so-called anti-flicker segments which are each located in one of the two lines of the other field enclosing the relevant line in the first field, and to a digital oscilloscope comprising such a device.

U.S. Pat. No. 4,263,593 discloses a television-type interlaced display device of the abovementioned kind.

SUMMARY OF THE INVENTION

An object of the invention is to improve the definition of an image reproduced by a television-type interlaced display of such a kind.

A television-type interlaced display of the kind mentioned in the preamble according to the invention is characterized in that said processing means are only made operative when, by means of a test path, the occurrence of situations corresponding to the presence of horizontal portions in one of the fields is detected.

By this measure, which improves the definition of a displayed image, the display device becomes also very suitable for the display of signals produced by a digital oscilloscope.

Cost considerations might lead to the optional use of only one anti-flicker segment when the trace is slightly ascending or descending. In the case of a perfectly horizontal trace portion the whole solution is retained: two anti-flicker segments are associated with the interpolation segment, and associated with them there is roughly a luminous energy quantity which has the same value as that of the interpolation segment (since these two segments each have a twice weaker energy) and the same center of gravity (as these two segments are identical and positioned symmetrically). The lightening rate is thus brought to, for example, 50 Hertz in the abovementioned case in which the interlaced scanning is effected at 25 Hertz, without the slight increase in the width of the trace produced in the region where this anti-flicker processing is effected becoming annoying. On the contrary, this processing, which is agreeable to the eye since it doubles the frequency of the light energy, ensures that the center of gravity of the signal is maintained and consequently does not change the precision of the measurement effected by the eye when an oscillogram is examined. But above all, in accordance with the invention, the processing operation is only employed from position to position on the trace, only for its horizontal or slightly sloping portions, which ensures that the other portions of the trace maintain their high quality and their maximum resolution.

DESCRIPTION OF THE DRAWING

The invention will now be described with reference to the accompanying drawings, in which:

FIG. 6 shows the same principle, on one hand, for the case in which two segments are provided and, on the other hand, for the case in which only one segment is provided, chosen in accordance with the direction in which the trace inclines;

FIG. 7 shows the decoding Table of an expression Delta defined for the search, in accordance with the invention, of situations where the anti-flicker processing operation is necessary; and FIGS. 8a 8g illustrate in detail a set of logic circuits which, from the possible values of the expression Delta, make it possible to supply a signal which is indicative of the presence of the said situations and intended to control the operation of the anti-flicker processing device.

DESCRIPTION OF THE PREFERRED EMBODIMENTS

One of the features of a digital oscilloscope is that the real-time analog signal is first sampled and thereafter stored in a digital store before being recovered. During recovery, to avoid a situation in which an operator inadvertently considers two samples which are close to each other on the screen but which are actually not consecutive in the time as being related to each other, an interpolation is provided between consecutive samples (for example in the form of additional samples) to eliminate incertainty as regards the interpretation of the displayed images (see, for example, U.S. Pat. No. 4,300,162). The simplest interpolation is the linear interpolation which consists in forming on the display screen a vector whose ends coincide with the representative points of the samples contained in the store.

Figure 1:
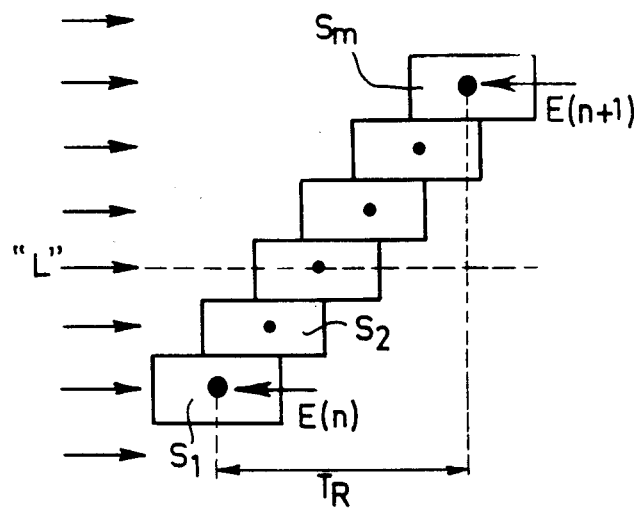
FIGS. 1 and 2 illustrate the known principle of interpolation for a digital oscilloscope.

During the scan of a television-type display device, the screen is horizontally scanned line-by-line at a regular rate, which implies a vertical digitization of the information. The ends of the interpolation vector are therefore generally situated on different and non-contiguous scanning lines. The principle of this interpolation is shown in FIg. 1: the discrete nature of the vertical resolution necessitates that the vector be formed by means of small horizontal segments $S_1$ to $S_m$ which are situated on the available intermediate lines (corresponding to the arrows pointing to the right in the Figure) and which overlap to a certain extent in the horizontal projection to ensure an apparent continuity of the interpolation factor. The available number of these intermediate lines depends on the amplitude deviation between two consecutive samples $E(n)$ and $E(n+1)$.

Figure 2:
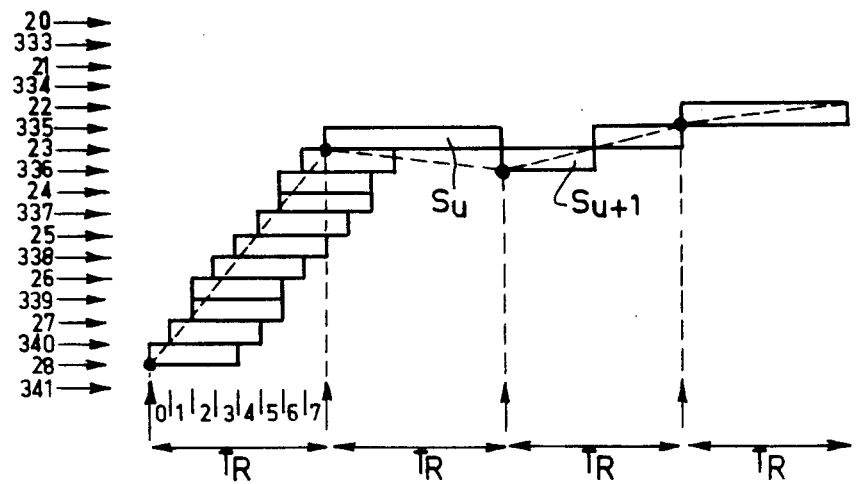

In the event that no scanning line is available between two sampling positions, the interpolation vector comprises a single interpolation segment which has a duration of one complete recovery period $T_R$ to ensure the continuity of the trace (i.e. the segments $S_u$, $S_{u+1}$, etc. . . . in FIG. 2). To benefit fully from the contribution of the interpolation vector, it is necessary for the display of this vector to have the best possible resolution; to that end, the television-type scan is used in the interlaced mode, which however has the disadvantage that it introduces flicker. Actually, when a portion of the trace is horizontal or slopes very slightly, this portion relates only to one single scanning line and is consequently produced only once in every two fields, even or odd: the energy of this horizontal portion does, for example, appear only every 40 milliseconds at a frequency of 25 Hertz (instead of every 20 milliseconds in the case of a non-interlaced 50 Hertz scan), which is beyond the capacity of integration of the eye. The viewer then experiences an unpleasant fluctuation of the luminous energy, the flicker effect.

The invention has for its object to provide a television-type interlaced display device in which a processing circuit is provided which eliminates this flicker effect, but only when the trace has actually horizontal or slightly sloping portions.

As described above, the display device in accordance with the invention is useful when, as a function of the local behavior of the quantity to be shown on the display screen, the trace, after all the interpolations, is provided in certain regions by low horizontal segments each of which only belongs to one single trace. In those cases the energy of these trace portions appear at a rate of 25 Hertz and gives a very unpleasant sensation to the eye.

Figure 3:
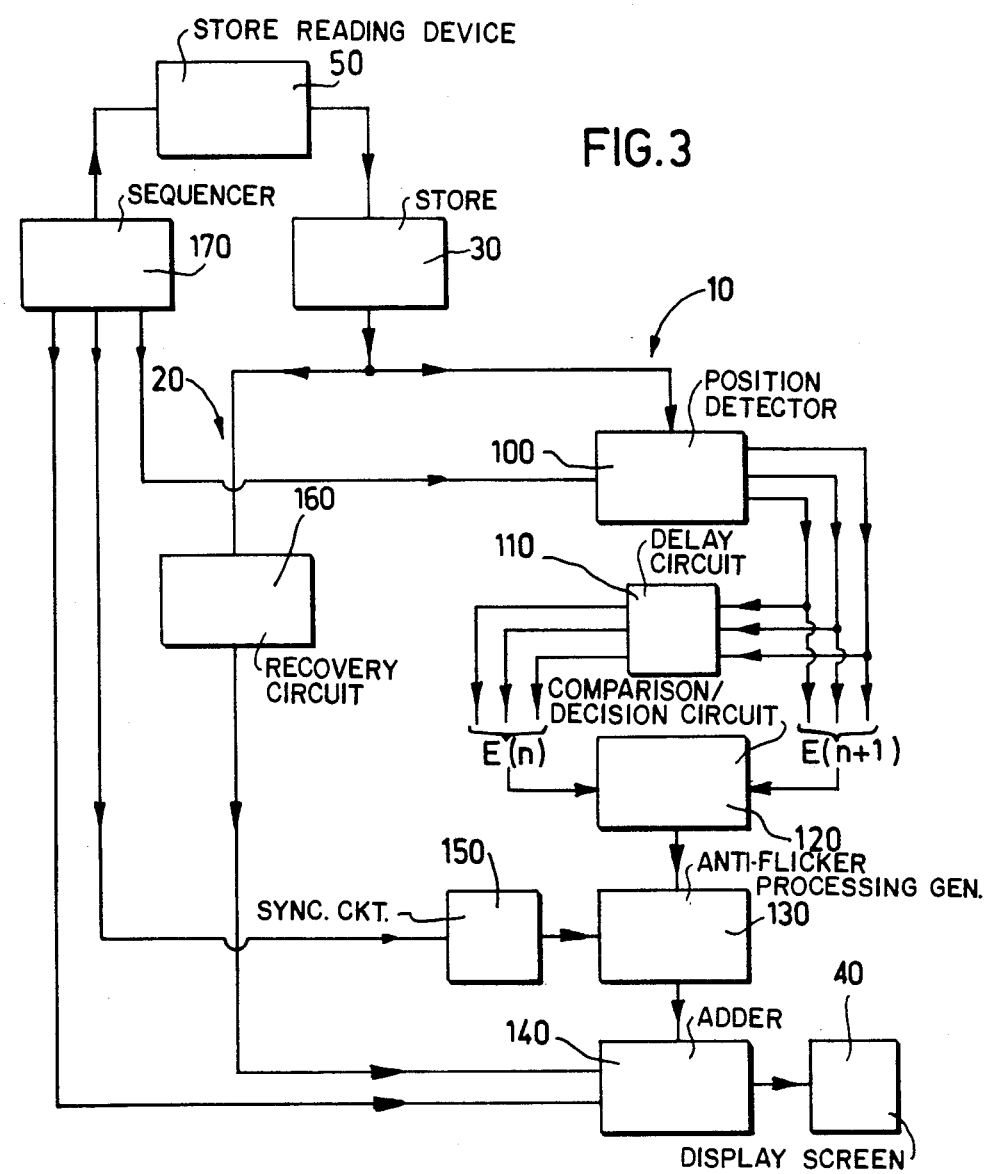
FIG. 3 illustrates, with a block schematic diagram, an anti-flickering processing circuit for an interlaced television-type display according to the invention.

To obviate these situations, the display device in accordance with the invention comprises, in conformity with the functional circuit diagram of FIG. 3, a so-called test path 10, which is arranged in parallel with a video path 20, for recovering the trace by means of interpolation, which interconnects a digital store 30 and a display screen 40. The digital store 30 indeed contains the regular sequence of digital values which represent the respective amplitudes of the samples of the sampled signal applied to the oscilloscope (in proportion to an amplitude value per unit of time determined by the sampling frequency), the content of this store being renewable at the rate determined by the acquisition device, not shown, of the oscilloscope (for example all the images, or at a much slower rate). A device 50 for reading the store, which is coupled to the spot travelling along a scanning line, is associated with this store 30.

Figure 4:
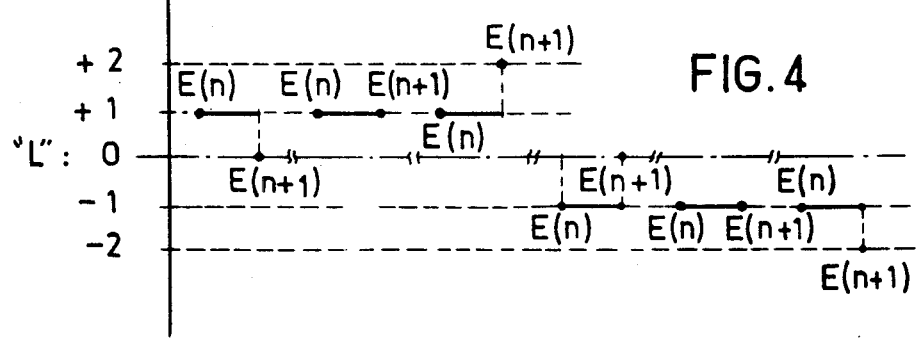
FIG. 4 shows, for a processing line, the different positions in which it is used to produce anti-flicker structure.

The test path 10, which operates at the sample recovery rate, for example 5 Megahertz, determined by a sequencer 170, comprises a detector 100 for detecting the position of the samples which are sequentially supplied by the store 30 with reference to the moving line (L) of FIG. 1. Connected to the detector 100, there is the output of the store 30, and also the end of an output lead of the sequencer 170, (along which lead the information "L" of the number of the position of the line in the vertical plane of the screen is moved), and supplies three distinct outputs according to the result of the comparison between "L" and the position of the relevant sample E(n). This detector 100 comprises a first comparator which indicates whether "L" is equal to, higher or lower than the position E(n), and a second comparator which is assisted by an adder to compare L to E(n+1). The detector 100 is followed by a delay circuit 110, which delays the positional information attained from the detector 100 relative to the sample E(n) of the horizontal position n, while a new positional information is produced, which this time relates to the following sample E(n+1) of the position n+1. So if "L" is the ordinal number defining the position of the line during scanning in the vertical plane of the screen (which line is referenced 0 in FIG. 4, the two immediately preceding and subsequent lines being given the reference numerals +1, +2 and −1, −2, respectively), six relative positions of the samples correspond, as shown in FIG. 4, to these situations in which the anti-flicker processing operation must be effected in the display device 40.

Figure 5:
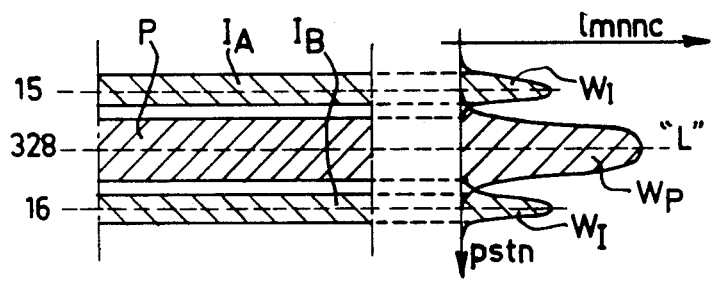
FIG. 5 shows the structure of the segments for suppressing the anti-flicker phenomena.

A comparison and decision circuit 120 generates a specific indication signal (denoted AP) if the presence of one of these relative positions is detected and this indication signal then makes an anti-flicker processing generator 130 operative, which is controlled at the same sample recovery rate as in the foregoing (5 Megahertz in this example) to ensure the ultimate synchronization with the video signal of the interpolated trace and is in the form of a bistable multivibrator which converts the indication signal into a horizontal segment having a duration which is equal to the interval which separates two consecutive samples, one of which must appear on only one or on two lines (L−1) and (L+1) of the other field, as the case may be. When, during the scanning procedure of the moving line "L" of a field, the comparison and decision circuit 120 detects that there is one of the six relative positions of the samples shown in FIG. 4, that is to say the existence of a signal representing a horizontal or slightly inclined graphic portion located on either the one or the other of the two adjacent lines which belong to the second field which is not displayed at the moment, the generator 130 commands the assembly, on the moving line of the first field, of a segment for suppressing the flicker phenomena which is in parallel with, has the same length and here has an energy which is about one-half that of the graphic interpolation segment located in the second field; the second anti-flicker segment will thus be assembled during the scanning operation of the next moving line of the same first field. FIG. 5 shows the principle of this construction, where, on a greatly enlarged scale, there is shown on one line, the line 328 of, for example, the even field, a horizontal segment P of the trace reconstructed by means of interpolation, and having an energy $W_P$, the lines 15 and 16 of the odd field, enclosing the line 328, consequently support two segments $I_A$ and $I_B$ which enclose the segment P and each convey an energy $W_I = W_P/2$, and have a length equal to the length of the interpolation segment and with an amplitude which is one-half the amplitude of the interpolation segment.

For the case in which the segment which is affected by flicker is not horizontal but slopes somewhat, it is possible (see FIG. 6) to effect the construction, on the second field, of only one of the two parallel anti-flicker segments enclosing the initial segment: namely the segment which, relative to the initial segment $P_n$, is located at the side to which the sloping progression of the trace is effected, that is to say the segment $I_n$ located at the side where the next initial segment $P_{n+1}$ is located which is also affected by flicker.

One of the possible embodiments of the comparison and decision circuit 120 arranged in the path 10 will now be described. When the number of the line "L" can vary from 0 to 511 (512 useful lines are taken as the limit) and the value "E" which defines the position of the samples, can also vary from 0 to 511, "L" and "E" are defined by 9-bit binary numbers from which it is possible to define the expression Delta=D=E−L with 9 bits plus possibly 1 borrow, that is to say ten bits $B_0$ to $B_8$ plus the borrow bit C, Delta being the difference (in lines) between the vertical position of the sample E from the store 30 and the vertical position of the present scan line L. FIG. 4 shows that the anti-flicker processing operation is applicable to six predetermined situations of the sample E(n+1) relative to the sample E(n). The control indication signal AP of the generator 130 therefore appears only in these six situations, in accordance with the following logic equation:

$$AP = AP_1 + AP_2$$

wherein:

$$AP_1 = [D(n) = +1] \cdot [(D(n+1) = 0) + (D(n+1) = +1) + (D(n+1) = +2)]$$

$$AP_2 = [D(n) = 0+1] \cdot [(D(n+1) = 0) + (D(n+1) = -1) + (D(n+1) = -2)]$$

the operators being in these expressions of course logic operators (the signal AP must, broadly speaking, be used for traces which are perfectly horizontal, if not the resultant anti-flicker energy would not be able to maintain the same center of gravity as the energy corresponding to the exact trace of the signal, and the anti-flicker processing operation would then produce a visible vertical vibration of this recovered trace).

In the example described here, it has been opted for to express Delta in a two's complement binary code, which for this expression results in the decoding Table of FIG. 7, in which the number of bits are shown on the abscissa and the line numbers on the vertical axis. It will be obvious from this Table that the following auxiliary logic functions can be defined with the aid of two AND-gates (see FIGS. 8a and 8b, respectively):

$$FA_1 = \bar{B}_2 \cdot \bar{B}_3 \cdot \bar{B}_4 \cdot \bar{B}_5 \cdot \bar{B}_6 \cdot \bar{B}_7 \cdot \bar{B}_8 \cdot C$$

$$FA_2 = B_2 \cdot B_3 \cdot B_4 \cdot B_5 \cdot B_6 \cdot B_7 \cdot B_8 \cdot C$$

From the expression of these two functions, the logic expressions $D(n+1) = +1$ and $D(n+1) = -1$ can be deduced, also with the aid of a simple AND-gate for each case (see FIGS. 8c and 8d, respectively):

$$[D(n+1) = +1] = (FA_1 \cdot B_o \cdot \bar{B}_1)_{n+1}$$

$$[D(n+1) = -1] = (FA_2 \cdot B_o \cdot B_1)_{n+1}$$

It is then possible to define the auxiliary logic functions $FA_3$ and $FA_4$ intended to express $AP_1$ and $AP_2$ (see FIGS. 8e and 8f, respectively):

$$FA_3 = FA_{1(n+1)} \cdot (\bar{B}_0 + \bar{B}_1)_{n+1} \cdot (D(n) = +1)$$

$$FA_4 = FA_{1(n+1)} \cdot \bar{B}_{0(n+1)} \cdot \bar{B}_{1(n+1)} \cdot (D(n) = -1)] + [FA_{2(n+1)} \cdot B_{1(n+1)} \cdot (D(n) = -1)]$$

Finally, the indication signal AP appears if at least one of the functions $FA_3$ or $FA_4$ is present at the inputs of an OR-gate, shown in FIG. 8g and at whose output AP, the control signal of the generator 130 for the anti-flicker processing operation, is present, which receives from a synchronizing circuit 150 connected to the sequencer 170 the recovery rate of the samples.

The anti-flicker signal, which as described above is assembled from two segments located in a displayed field which encloses the initial interpolation segment located in the other field not displayed at the moment, is supplied from the output of the test and processing path 10, to be combined in an analog adder 140 with the video signal of the interpolated trace supplied by the recovery circuit 160 of the signal by means of interpolation vectors and with the synchronizing signal of the receiver and the electronic gating signal which are both produced by a sequencer 170, whereafter the anti-flicker signal is conveyed to the display screen 40. It should be noted that the video-path 20 for recovering the trace by means of interpolation comprises a delay circuit, not shown, which effects on the signals flowing through it a delay which is a multiple of the recovery period $T_R$ and intended to render it possible to effect in the region of the adder 140 synchronization with the output signals of the path 10.

The new trace obtained, which on display appears wider than the original trace but not twice as wide as in prior art systems due to the reduced energy of the anti-flicker segments, is from now on free from any flicker. In addition, as the sum of the energy of the two anti-flicker segments added together is equal to the energy from the initial interpolation segment, the center of gravity of this new energy is identical to the center of gravity of the energy of this initial segment and absolutely no error is generated in the position of the luminous trace, and no shift whatsoever from the center thereof relative to the other portions of the trace which have not been subjected to the anti-flicker processing operation, which maintains the precision of the measurements.

It will be obvious that the present invention is not limited to the embodiments described above and shown in the drawings, from which variations can be proposed without departing from the scope of the invention. More specifically it is possible, as regards FIGS. 8a to 8g, to use a different set of logic circuits if one wants to take account of the partial results supplied by the interpolation path 20. On the other hand it is possible, although this solution will actually be more expensive, to provide a field memory in which the data of the preceding field are stored.

What is claimed is:

1. A television-type interlaced display device in which a displayed signal includes scanning lines, alternate lines of which appear in one field and intervening lines of which appear in a following field, said display device comprising processing means, associated with segments (P) located on a line in a first field, for suppressing the effect of light fluctuations of segments of a light trace to be displayed, said processing means generating further parallel anti-flicker segments (I) which are located in two lines, respectively, of a second field following said first field, which two lines enclose the line in said first field containing said segments (P), characterized in that said display device further comprises means coupled to said processing means for making said processing means operative only when the occurrence of situations corresponding to the presence of horizontal sections in said light trace in one field, is detected.

2. A device as claimed in claim 1, characterized in that said means for making said processing means operative includes a test path comprising a logic circuit which compares the positions of consecutive samples of the trace relative to a moving scanning line (L) and supplies a control indication signal for the processing means if the existence of one of said situations is determined from the result of said comparison.

3. A device as claimed in claim 2, characterized in that the energy of the anti-flicker segment or segments are one-half the energy of the segments.

4. A television-type interlaced display digital oscilloscope, characterized in that it comprises a display device as claimed in claim 2.

* * * * *